United States Patent
Child et al.

(10) Patent No.: US 6,305,079 B1
(45) Date of Patent: Oct. 23, 2001

(54) METHODS OF MAKING PLATE-FIN HEAT EXCHANGERS

(75) Inventors: Malcolm S. Child, Arlington, MA (US); James B. Kesseli, Mont Vernon, NH (US); James S. Nash, West Newbury, MA (US)

(73) Assignee: Ingersoll-Rand Energy Systems Corporation

( * ) Notice: Subject to any disclaimer, the term of this patent is extended or adjusted under 35 U.S.C. 154(b) by 0 days.

(21) Appl. No.: 09/409,641

(22) Filed: Oct. 1, 1999

Related U.S. Application Data (63) Continuation of application No. 09/239,664, filed on Jan. 29, 1999, now Pat. No. 5,983,992, which is a continuation of application No. 08/792,261, filed on Jan. 31, 1997, now abandoned.
(60) Provisional application No. 60/010,998, filed on Feb. 1, 1996.

(51) Int. Cl.[7] .................................................. B23P 15/26
(52) U.S. Cl. ................................ 29/890.039; 29/890.054
(58) Field of Search ..................... 29/890.039, 890.03, 29/890.034, 890.035, 890.054

(56) References Cited

U.S. PATENT DOCUMENTS

| | | |
|---|---|---|
| 1,079,468 | 11/1913 | Bowerbank . |
| 2,566,310 | 9/1951 | Jacobsen et al. ..................... 165/153 |
| 2,656,155 | 10/1953 | Garratt ................................... 165/79 |
| 2,782,009 | 2/1957 | Rippingille .......................... 165/166 |
| 2,858,112 | 10/1958 | Gerstung ............................. 165/153 |
| 3,042,382 | 7/1962 | Hryniszak ........................... 165/167 |
| 3,313,344 | 4/1967 | Hayden . |
| 3,473,210 | 10/1969 | Klank . |
| 3,805,889 | 4/1974 | Coolidge ............................. 165/153 |
| 4,144,933 | 3/1979 | Asselman et al. .................... 165/153 |
| 4,291,754 | 9/1981 | Morse et al. ......................... 165/167 |
| 4,815,532 | 3/1989 | Sasaki et al. . |
| 4,869,317 | 9/1989 | Tubb et al. ........................... 165/167 |
| 5,067,476 | 11/1991 | Ryan et al. ............................. 165/79 |
| 5,375,328 | * 12/1994 | De'Longhi ....................... 29/890.039 |
| 5,383,517 | * 1/1995 | Dierbeck ............................. 165/144 |
| 5,429,185 | 7/1995 | Trage et al. . |
| 5,507,338 | * 4/1996 | Schornhorst et al. .......... 29/890.039 |
| 5,517,757 | * 5/1996 | Hayashi et al. ................. 29/890.039 |
| 5,604,981 | * 2/1997 | frazier et al. ................... 29/890.039 |

FOREIGN PATENT DOCUMENTS

| | | |
|---|---|---|
| 1494167 | 9/1967 | (FR) . |
| 1254372 | 11/1971 | (GB) . |
| 1304692 | 1/1973 | (GB) ................................... 165/153 |
| 236491 | 6/1969 | (SU) ................................... 165/167 |

* cited by examiner

Primary Examiner—I Cuda Rosenbaum
(74) Attorney, Agent, or Firm—Michael Best & Friedrich LLP (57) ABSTRACT

A method of making a heat exchanger includes assembling one or more heat exchange cells. Each heat exchange cell is assembled by providing a top plate having an inlet aperture at one end thereof, an outlet aperture at the other end thereof, a first surface, a second surface and peripheral edges; and providing a bottom plate having an inlet aperture at one end thereof, an outlet aperture at the other end thereof, a first surface, a second surface and peripheral edges. The second surfaces of the top and bottom plates are juxtaposed with one another so that the inlet and outlet apertures of the plates are in substantial alignment with one another. The peripheral edges of the top and bottom plates are attached to form a high pressure chamber between the second surfaces of the plates. After being assembled, each individual heat exchange cell is tested before being attached to other heat exchange cells. The testing may include pressure testing of the heat exchange cell. The testing of each individual cell improves the quality and reliability of the fully assembled heat exchanger because each level of the heat exchanger has been pre-tested for defects (e.g. leaks) prior to further assembly steps.

36 Claims, 12 Drawing Sheets

METHODS OF MAKING PLATE-FIN HEAT EXCHANGERS

The present application is a continuation of U.S. patent application Ser. No. 09/239,664, filed Jan. 29, 1999, is now U.S. Pat. No. 5,983,992, which is a continuation of U.S. patent application Ser. No. 08/792,261 filed Jan. 31, 1997 now abandoned which, in turn, claims benefit under 35 U.S.C. Section 119(e) of U.S. Provisional Application 60/010,998 filed Feb. 1, 1996. The disclosures set forth in U.S. patent application Ser. No. 09/239,664, U.S. patent application Ser. No. 08/792,261 and U.S. Provisional Application 60/010,998 are hereby incorporated by reference herein.

BACKGROUND OF THE INVENTION

This invention relates generally to plate-fin heat exchangers and more particularly to a counter-flow plate-fin heat exchanger with cross-flow headers used as a recuperator. Plate fin heat exchangers are typically monolithic structures created by brazing their many constituent pieces in a single furnace cycle. This general design presents several problems including the following:

1) A plate fin heat exchanger typically includes hundreds, if not thousands, of brazed joints. Thus, the overall quality of the finished product depends on the reliability of each and every brazed joint so that even one defective brazed joint can result in the entire heat exchanger being scrapped. As a result, assembly methods for plate fin heat exchangers are generally labor intensive as assemblers must avoid the creation of even a single poor braze among thousands in a typical heat exchanger.

2) The dimensions of the constituent parts used to assemble the heat exchanger must be maintained within close tolerances in order that differences in thickness do not compound into gross differences in load during the brazing cycle.

3) Edge bars or closure bars used to carry load through the edges of the heat exchanger make assembly both labor and material intensive and create stiffness and mass discontinuity differences in thermal response time.

With regard to the above design, counterflow plate-fin heat exchangers with cross-flow headers typically include a stack of headers sandwiched together to form an alternating gas/air/gas/air header pattern. Each pair of adjacent gas and air headers is separated by a relatively thin parting sheet. Additionally, conventional plate-fin heat exchangers incorporate edge bars or closure bars to seal about the perimeters of the parting sheets and prevent overboard leakage from the high pressure side of the heat exchanger. Inlet and outlet manifold ducts are welded transverse to the edge bars after the headers are assembled and brazed. The edge bars create a stiff and massive structural attachment between the parting sheets. Thermal loading produces faster thermal response in the lighter parting plates than the more massive edge bars. This difference in response time rate combined with the relative weakness of the parting plates can produce damage in the parting plates. Due to differences in the position and structural composition of the parting sheets and edge bars, the temperature changes do not affect the bars and sheets at the same rate. Since the parting sheets are structurally weaker than the edge bars, the parting sheets are strained.

A second problem associated with the use of edge bars in counterflow plate-fin heat exchangers is related to the sheet metal manifold ducts that are welded to the edge bars. The manifolds are welded to the stack of edge bars along the sides and corners of the core adjacent the header openings. Like the parting sheets, the manifold ducts respond quickly to changes in temperature. Since the edge bars do not respond to changes in temperature as quickly as the manifold ducts, the sheet metal experiences a shear load at or near the weld. As a result, the weld and the base metal in the heat affected zone is likely to become damaged.

U.S. Pat. No. 2,858,112 to Gerstung discloses a cross-flow heat exchanger for transferring heat from a liquid (FIG. 1) in which multiple pairs 10 of corrugated plates 12 and 14 are spaced apart by air centering means 16 and heat exchanger or edge bar elements 18 and 20. The edge bar elements 18 and 20 are sandwiched between the aligned header openings 30 and 32 of the respective plates 12 and 14. The utilization of the edge bar elements 18 and 20 adds undesirable rigidity and thermal mass discontinuity to the structure. As a result, the various layers of the structure are unable to move independently of one another during operation. Thus, the heat exchanger disclosed in the Gerstung patent is not appropriate for use with a gas turbine because the exchanger cannot withstand the tremendous temperature extremes produced by a gas turbine.

Great Britain Patent 1,304,692 to Lowery (FIGS. 1 and 5) discloses a cross-flow heat exchanger for transferring heat from a liquid including a plurality of metal plates 24 shaped and bonded together. The plates 24 have fin members 16 and 17 bonded to their respective outer surfaces. Each plate 24 has two centrally apertured raised end portions 25 and 26 and also has two parallel inverted channels 27 and 28. The respective units are assembled together by placing the next unit in the sequence with its raised end portions 25 and 26 in contact with equivalent raised end portions of the previous unit in the sequence, and by applying pressure to the juxtaposed pair of raised end portions 25 and 26. The relatively large intermeshing surface areas of adjacent raised end portions 25 and 26 results in the formation of rigid flow ducts so that the various layers of the final structure are incapable of moving and flexing relative to one another.

Based on the foregoing limitations known to exist in present plate-fin heat exchangers, it would be beneficial to provide a heat exchanger having a compliant bellows structure capable of elastically absorbing deflections produced by temperature gradients attendant with the heat exchange process and thermal gradients associated with installation or operation, so that the individual layers of the heat exchanger can move and flex freely relative to one another, and can accommodate thermal deflections throughout of plane deformation.

SUMMARY OF THE INVENTION

In accordance with certain preferred embodiments of the present invention, a heat exchanger for transferring heat between an external fluid and an internal fluid includes two or more heat exchange cells. Each heat exchange cell preferably includes a top plate having an inlet aperture at one end thereof and an outlet aperture at the other end thereof, the top plate including a first surface, a second surface and peripheral edges. The heat exchange cell may also include a bottom plate juxtaposed with the top plate having an inlet aperture at one end thereof and an outlet aperture at the other end thereof. The bottom plate also preferably includes a first surface, a second surface and peripheral edges, the peripheral edges of the bottom and top plates being attached to one another, whereby the second surfaces of the top and bottom plates confront one another and the inlet and outlet apertures of the top and bottom plates are in substantial alignment with one another. The aligned inlet apertures and outlet apertures of the respective attached top and bottom plates preferably provide an inlet manifold on one side of the cell and an outlet manifold at the other side of the cell. The inlet and outlet apertures of the top and bottom plates may include substantially S-shaped raised flange portions extending away from the first surfaces of the plates, the substantially S-shaped raised flange portions terminating at interior edges bounding the apertures. The attached top and bottom plates preferably define a high pressure chamber between the second surfaces thereof so that the internal fluid may pass through the heat exchange cell at a higher pressure than the external fluid. The heat exchanger also preferably includes an internal finned member disposed within the high pressure chamber and attached to the second surfaces of said top and bottom plates. The individual heat exchange cells are preferably assembled one atop the other with the adjacent interior edges of adjacent heat exchange cells attached together for forming a compliant bellows structure capable of elastically absorbing deflections produced during thermal loading so that the heat exchange cells may move and flex relative to one another.

In certain preferred embodiments, each heat exchange cell includes an internal finned member and two external finned members, a first one of the two external finned members being attached to the first surface of the top plate and a second one of the two external finned members being attached to the first surface of the bottom plate. Each heat exchange cell is designed for passing the external fluid through the two external finned members in a first flow direction and for passing the internal fluid through the internal finned member in a second flow direction substantially counter to the first flow direction. The internal fluid may be high pressure air passing through the internal finned member and the external fluid may be a low-pressure product resulting from combustion. In other embodiments, the internal fluid may be compressor discharge gases and the external fluid may be turbine discharge gases. During operation of the heat exchange cell, the two external finned members capture heat from the external fluid passing therethrough and transfer the heat to the internal finned member. The internal finned member then transfers the heat to the internal fluid passing therethrough.

Each top plate may include a substantially flat central region between the inlet and outlet apertures thereof and the bottom plate preferably includes a substantially flat central region between the inlet and outlet apertures thereof, the substantially flat central regions of the two plates being in substantial alignment with one another. In certain embodiments, the first one of the two external finned members overlies the substantially flat central region of the top plate, the second one of the two external finned members overlies the substantially flat central region of the bottom plate, and the internal finned member is disposed between the substantially flat central regions of the top and bottom plates. The internal finned member may be in substantial alignment with the two external finned members. The internal finned member is preferably brazed to the second surfaces of the top and bottom plates. In certain preferred embodiments, the first and second external finned members of each heat exchange cell may include substantially aligned leading edges for receiving the external fluid passing between the cell layers and trailing edges for discharging the external fluid after the external fluid has passed therethrough. The substantially aligned leading edges of the first and second external finned members are desirably substantially remote from at least one leading peripheral edge of the heat exchange cell for enabling the peripheral edge to deflect toward and away from a heat exchange cell adjacent thereto. In other preferred embodiments, the substantially aligned leading edges of the first and second external finned members are substantially offset from the aligned outlet apertures for enabling each cell layer to deflect toward and away from a heat exchange cell adjacent thereto. Offsetting the leading edges away from the bellows structure enables the bellows to flex and bend without being constrained by the external finned members. Placing the leading edges of the external finned members away from the at least one leading peripheral edge also reduces thermal forces acting upon the top and bottom plates of each cell.

The trailing edges of the first and second external finned members may also be in substantial alignment with one another, as well as being substantially remote from at least one rear peripheral edge of the heat exchange cell for enabling the cell to move toward and away from a heat exchange cell adjacent thereto. The substantially aligned trailing edges of the first and second external finned members may also be substantially offset from the aligned inlet apertures of the heat exchange cell for enabling each cell to deflect toward and away from a heat exchange cell adjacent thereto. Each heat exchange cell may also include at least one gas turning finned member attached adjacent a peripheral edge of one of the plates for directing the external fluid into a preferred path for impinging upon the two external finned members.

As mentioned above, the internal finned member is desirably disposed in the high pressure chamber of the cell and may have an inlet edge for receiving the first gas from the inlet manifold and an outlet edge for discharging the first gas to the outlet manifold. Each heat exchange cell may also include an inlet manifold finned member disposed in the high pressure chamber between the inlet manifold and the inlet edge of the internal finned member and an outlet manifold finned member disposed in the high pressure chamber between the outlet manifold and the outlet edge of the internal finned member. The inlet and outlet manifold finned members direct the internal fluid in a first direction and the internal finned member directs the internal fluid in a direction substantially perpendicular to the first direction. As mentioned above, heat is generally transferred between the external and internal fluids when the internal fluid passes through the internal finned member. The internal finned member of each cell is adhered to the top and bottom plates for providing resistance against differential pressure load so that no external pre-loading of the heat exchange cell is required.

The top and bottom plates and the substantially S-shaped raised flange portions thereof preferably have a substantially uniform thickness, thereby minimizing the effects of thermal expansion and contraction on the plates. At the outer perimeter of the cell, the substantially S-shaped raised flange portions join together to partially form and define a high pressure chamber, while the inner edges of the substantially S-shaped raised flange portions, i.e., the edges surrounding the inlet and outlet apertures of the attached plates, diverge from one another in each cell so that adjacent inner edges of adjacent cells may be attached together. The adjacent interior edges of the adjacent cells are preferably welded together to form a compliant bellows structure. In highly preferred embodiments, the heat exchange cells are attached to one another solely through the interior edges of the raised flanges. In these embodiments, the sections of the substantially S-shaped raised flanges away from or remote from the interior edges are not attached together. This enables the substantially S-shaped flange portions to independently move and flex in response to compressive, tension and lateral forces.

The foregoing and other aspects will become apparent from the following detailed description of the invention when considered in conjunction with the accompanying drawing figures.

DETAILED DESCRIPTION OF PREFERRED EMBODIMENTS

Figure 1:
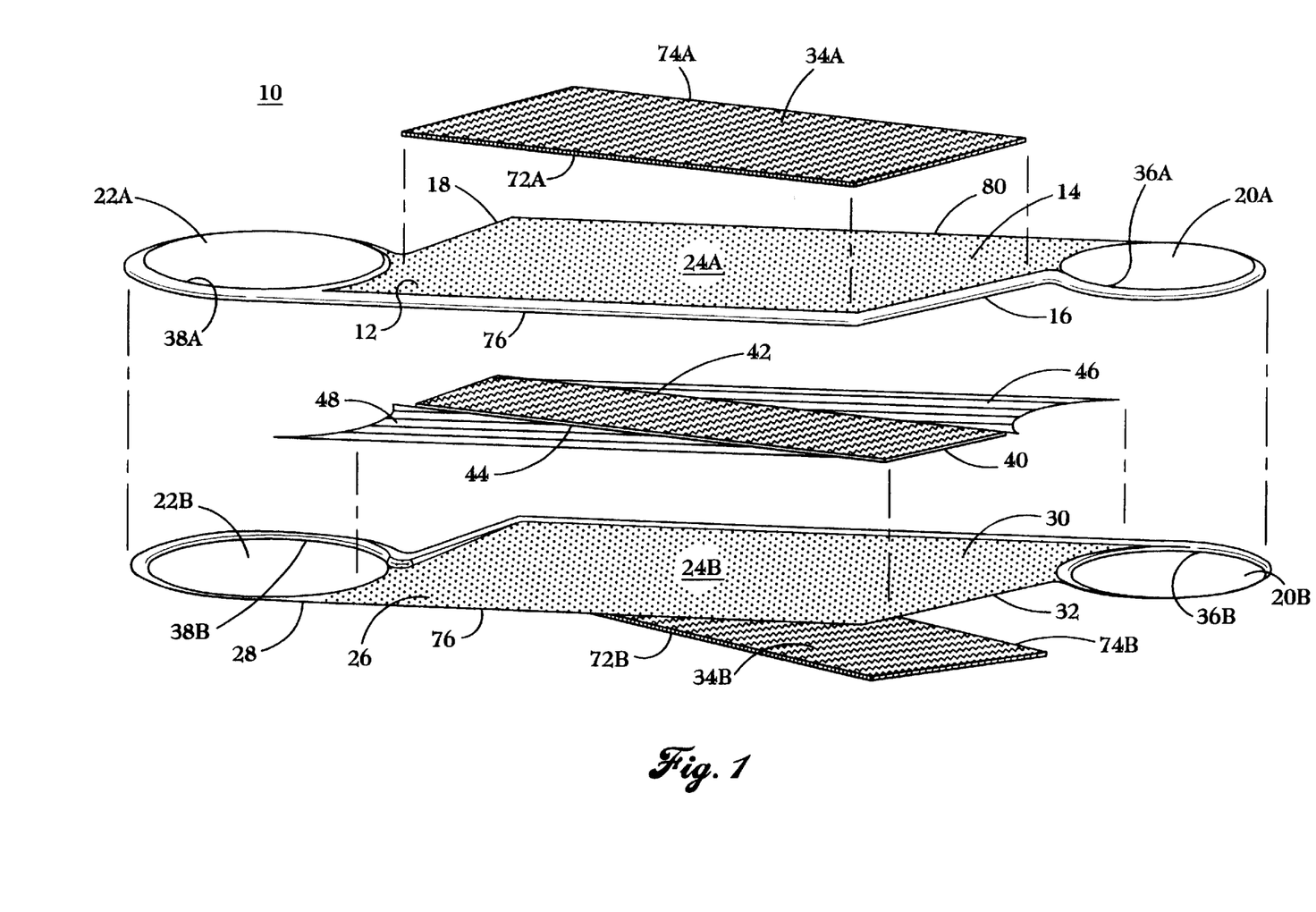
FIG. 1 shows an exploded view of an individual heat exchange cell for a counterflow heat exchanger in accordance with preferred embodiments of the present invention.

FIG. 1 shows an exploded view of an individual heat exchange cell 10 in accordance with certain preferred embodiments of the present invention. Each heat exchange cell 10 includes a self-contained pressure-tight structure which may be stacked atop other substantially identical heat exchange cells to produce a counterflow heat exchanger, such as the exchanger shown in FIG. 9 and described below.

Figure 2:
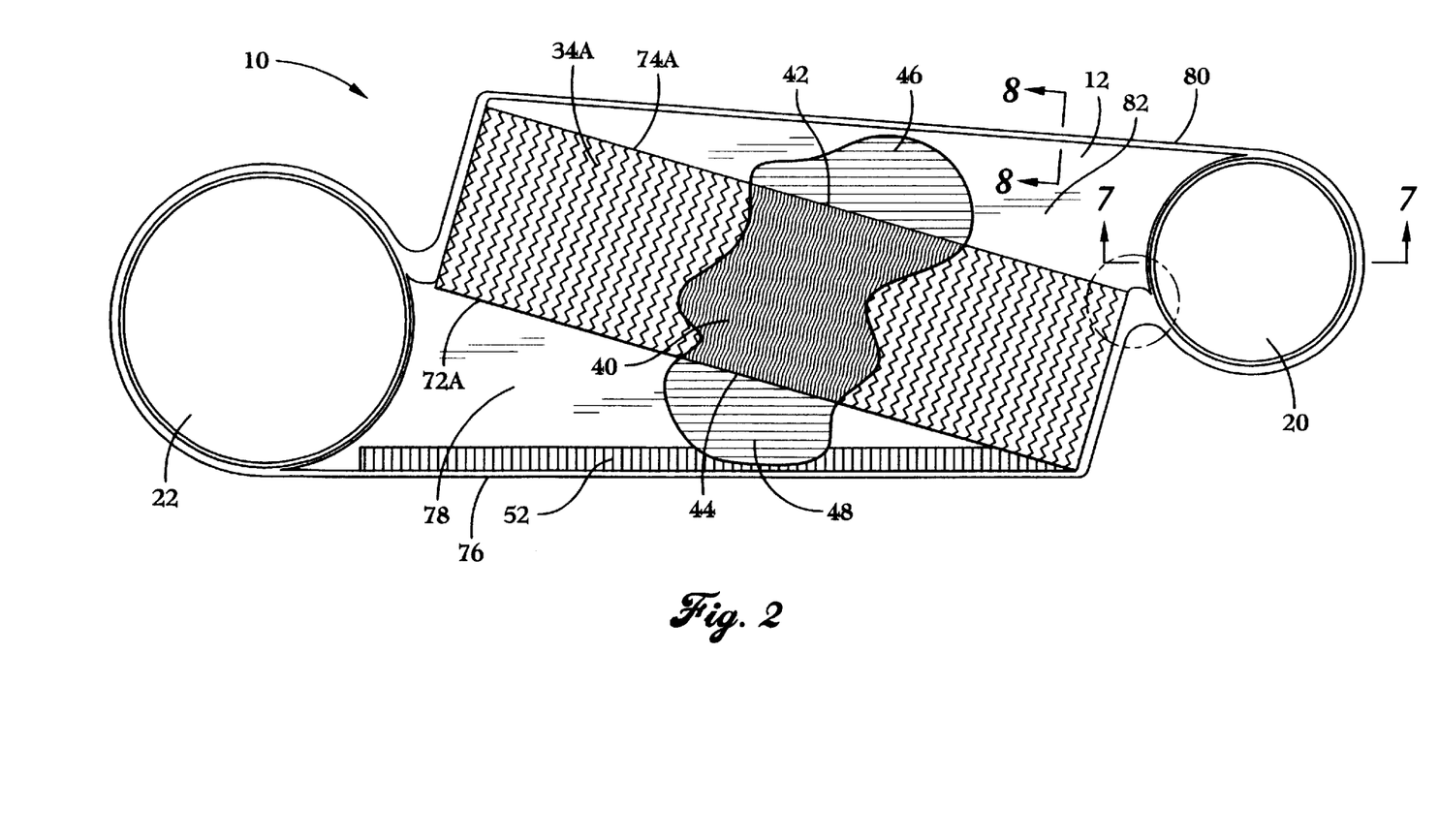
FIG. 2 shows a first plan view of the individual heat exchange cell shown in FIG. 1.

Each heat exchange cell 10 has all of the features required for providing a complete counterflow heat exchanger including inlet and exit manifolds and heat transfer fins assembled into a single unit cell, as shown in FIG. 2.

The utilization of individual heat exchange cells overcomes the following problems present in the prior art:

1) Allows for the inspection, correction and/or rejection of a small, manageable heat exchange cell rather than on a completed heat exchanger comprising a matrix of permanently assembled layers, thereby resulting in greater quality control and reduced scrap.

2) Allows for quality-control testing of individual heat exchange cells before the various layers are assembled together, thereby avoiding the risk and technical difficulty of brazing massive heat exchanger matrices.

3) Allows for slip and movement between layers to accommodate for thermal expansion and contraction, without the risk of leakage.

4) Allows for the rapid removal and replacement of defective heat exchange cells, as opposed to scrapping an entire heat exchanger when a defective layer is discovered.

Referring to FIGS. 1 and 2, in certain preferred embodiments, each individual heat exchange cell 10 preferably includes a top plate 12 having a first surface 14, a second surface 16 (FIG. 5) and one or more peripheral edges 18 defining outer edge(s) of the top plate 12. The top plate 12 preferably includes an inlet aperture 20A at one end thereof, an outlet aperture 22A at the other end thereof and a substantially flat central region 24A between the inlet and outlet apertures 20A and 22A. Each heat exchange cell 10 also preferably includes a bottom plate 26 that substantially mirrors the dimensions, size and shape of the top plate 12. The bottom plate 26 preferably has a first surface 28 (FIG. 6), a second surface 30 and one or more peripheral edges 32 defining outer edge(s) of the bottom plate 12. The bottom plate 26 also preferably includes an inlet aperture 20B at one end thereof, an outlet aperture 22B at the other end thereof and a substantially flat central region 24B (FIG. 5) between the inlet and outlet apertures 20B and 22B.

The heat exchange cell 10 preferably includes at least one finned member attached thereto for transferring heat between two or more fluids passing closely by one another. In one particular embodiment, the heat exchange cell 10 preferably includes two external finned members, a first one of the external finned members 34A attached to the first surface 14 of the top plate 12, preferably within the substantially flat central region 24A thereof; and a second one of the two external finned members 34B attached to the first surface 28 of the bottom plate 26, preferably within the substantially flat central region 24B thereof.

The heat exchange cell 10 is preferably assembled by juxtaposing the second surfaces 16, 30 of the top and bottom plates 12, 26 with one another so that the inlet apertures 20A, 20B and the outlet apertures 22A, 22B of the top and bottom plates 12 and 26 are in substantial alignment. The inlet apertures 20A, 20B include respective substantially S-shaped raised flange portions 36A and 36B terminating at interior edges bounding the inlet apertures 20A, 20B. Similarly, the outlet apertures 22A, 22B include respective substantially S-shaped raised flange portions 38A, 38B terminating at interior edges bounding the outlet apertures 22A, 22B. In other words, the substantially S-shaped raised flange portions of the attached top and bottom plates 12 and 26 diverge from one another at the interior edges thereof and are joined at the outer peripheral edges of the plates. Thus, each substantially S-shaped raised flange portion generally extends away from the first surface of the plate associated therewith so that the interior edge thereof lies above the first surface of the plate. In preferred embodiments, the top and bottom plates 12, 26 including the respective substantially S-shaped raised flange portions thereof are of substantially uniform thickness so that temperature changes occurring at the flanges are substantially the same as temperature changes occurring along the remainder of the top and bottom plates 12, 26, whereby thermal strain produced during operation of the heat exchanger is minimized.

The peripheral edges 18, 32 of the respective top and bottom plates 12 and 26 are then attached to one another, whereby the aligned inlet apertures 20A, 20B of the attached top and bottom plates 12 and 26 provide an inlet manifold of the heat exchange cell 10 and the aligned outlet apertures 22A, 22B of the attached top and bottom plates provide an outlet manifold of the heat exchange cell 10. The attached top and bottom plates 12, 26 define a high pressure chamber 52 (FIG. 5) between the second surfaces thereof so that a fluid may pass therethrough at a relatively higher pressure than do fluids passing over the first surfaces of the plates.

The heat exchange cell 10 also preferably includes an internal finned member 40 disposed between and attached to the second surfaces of the top and bottom plates 12, 26. The internal finned member 40 is preferably brazed to the second surfaces 16, 30 of the top and bottom plates 12, 26. When the cell is assembled, the internal finned member 33 is typically in substantial vertical alignment with the two external finned members 34A; 34B, the two external finned members also being in substantial vertical alignment with one another.

Figure 3:
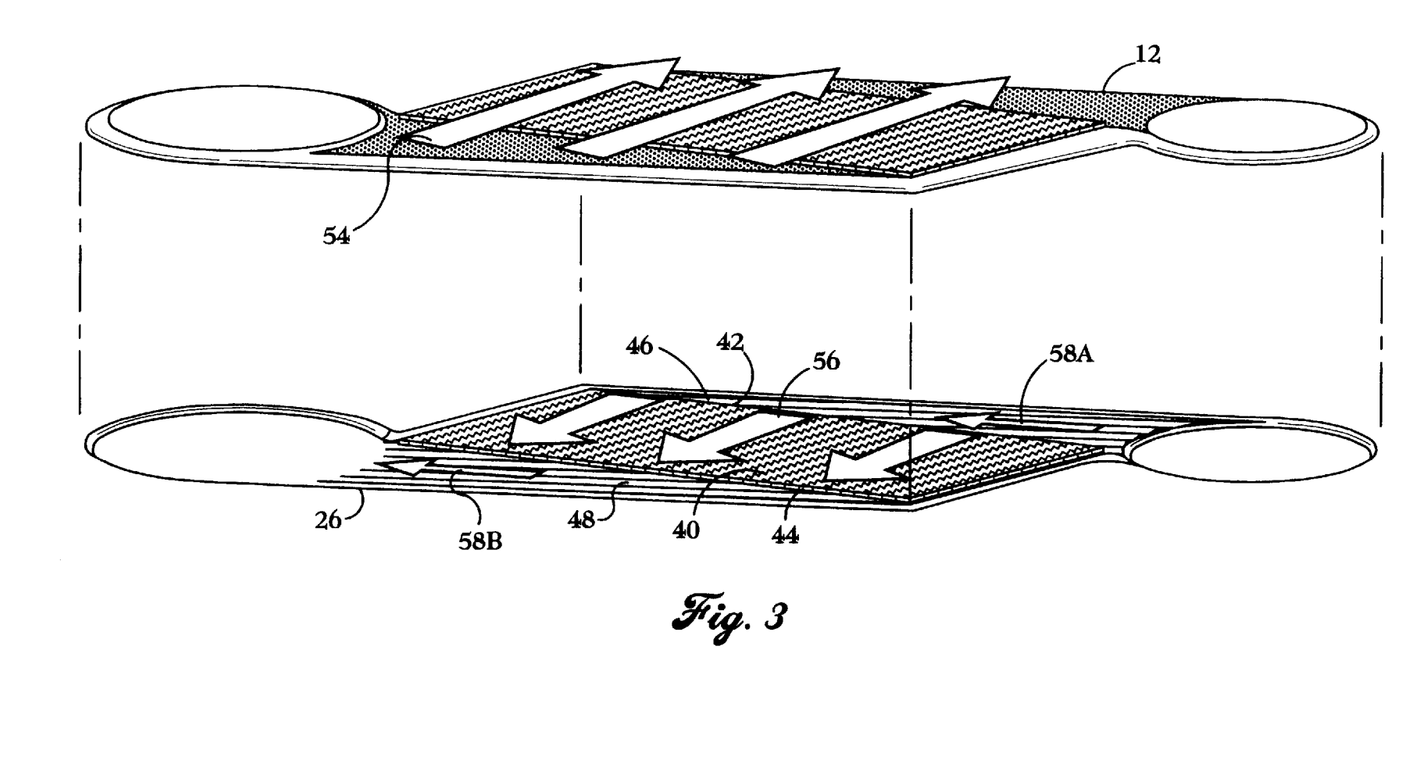
FIG. 3 shows an exploded view of the individual heat exchange cell of FIG. 1 after partial assembly thereof.

Referring to FIG. 3, each heat exchange cell 10 is preferably adapted for passing an internal fluid, such as a combustible gas, through the internal finned member 40 in a first flow direction designated 56 and for passing an external fluid, such as an exhaust gas, through the two external finned members 34 in a second flow direction designated 54 that is substantially counter to the first flow direction 54.

Referring to FIGS. 1–3, the internal finned member 33 attached to the second surfaces of the top and bottom plates 12 and 26 desirably includes an inlet end 42 for receiving the internal fluid from the inlet manifold 20 and an outlet end 44 for discharging the internal fluid to the outlet manifold 22. The heat exchange cell 10 may also include an inlet manifold finned member 46 disposed in the high pressure chamber between the inlet manifold 20 and the inlet edge 42 of the internal finned member 33 and an outlet manifold finned member 48 disposed in the high pressure chamber between the outlet edge 44 of the internal finned member 33 and the outlet manifold 22. As shown in FIG. 3, the inlet and outlet manifold finned members 46, 48 direct the internal fluid in first lateral or cross-flow directions 58A, 58B and the internal finned member 33 directs the external fluid in the direction designated 56 that is substantially perpendicular to the first lateral directions 58A, 58B.

Figure 4:
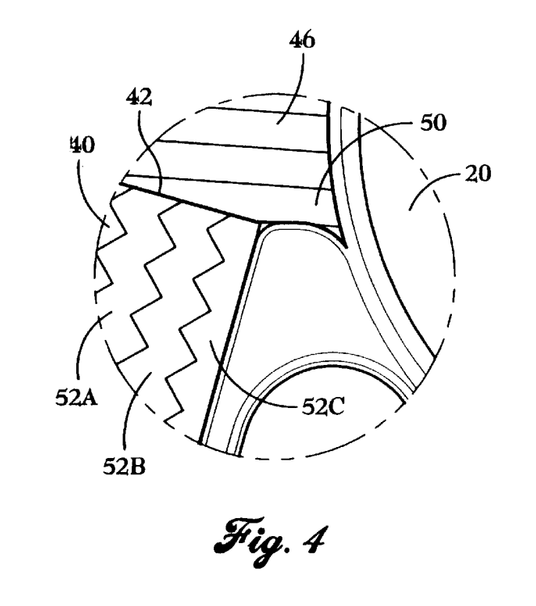
FIG. 4 shows an enlarged fragmentary view of an inlet header of the individual heat exchange cell shown in FIG. 2.
Figure 7:
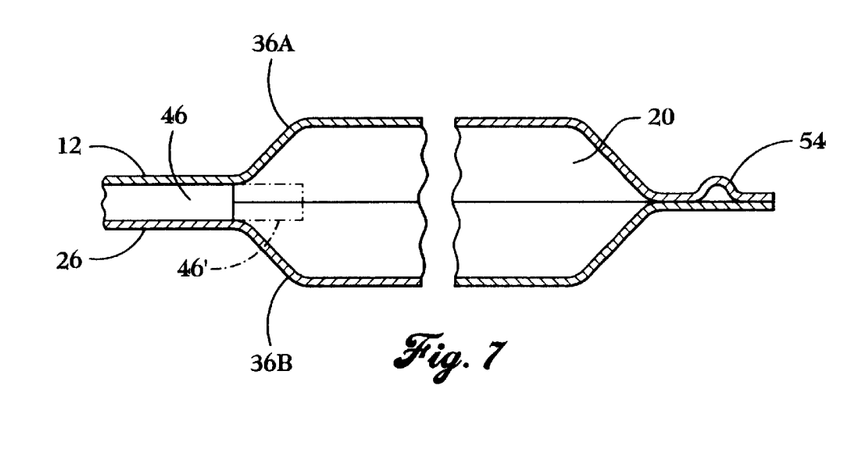
FIG. 7 shows a partial cross-sectional view of the inlet aperture taken along line 7—7 of FIG. 2, showing the raised flanges.
Figure 8:
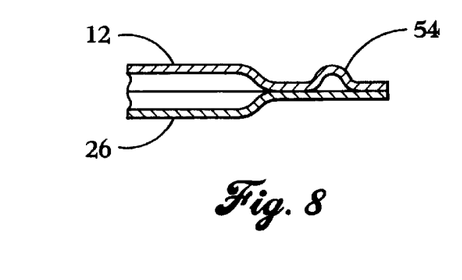
FIG. 8 shows a partial cross-sectional view of an edge of the individual heat exchanger element shown in FIG. 2, taken along line 8—8, showing the details of a braze reservoir.

FIG. 4 shows a fragmentary, close-up view of the inlet manifold 20, inlet manifold finned member 46 and internal finned member 33 of a preferred heat exchange cell 10. In this embodiment, the inlet manifold finned member 46 includes a series of channels 50 which serve as conduits for passing the internal fluid from the inlet manifold 20 to the first edge 42 of the internal finned member 33. In preferred embodiments, each channel 50 is in fluid communication with a plurality of channels 52A, 52B, 52C of the internal finned members 33. Referring to FIG. 8, in certain embodiments the inlet manifold fins 46 (or the outlet manifold fins) may terminate at the portion of the top and bottom plates 12 and 26 where the plates diverge to form substantially S-shaped raised flanges 36A, 36B. This termination configuration is shown in solid font in FIG. 7. Alternatively, the inlet manifold fins may extend beyond the portion of divergence of the plates 12, 26 in the manner shown in FIG. 7 by dashed font designated 46'.

Figure 5:
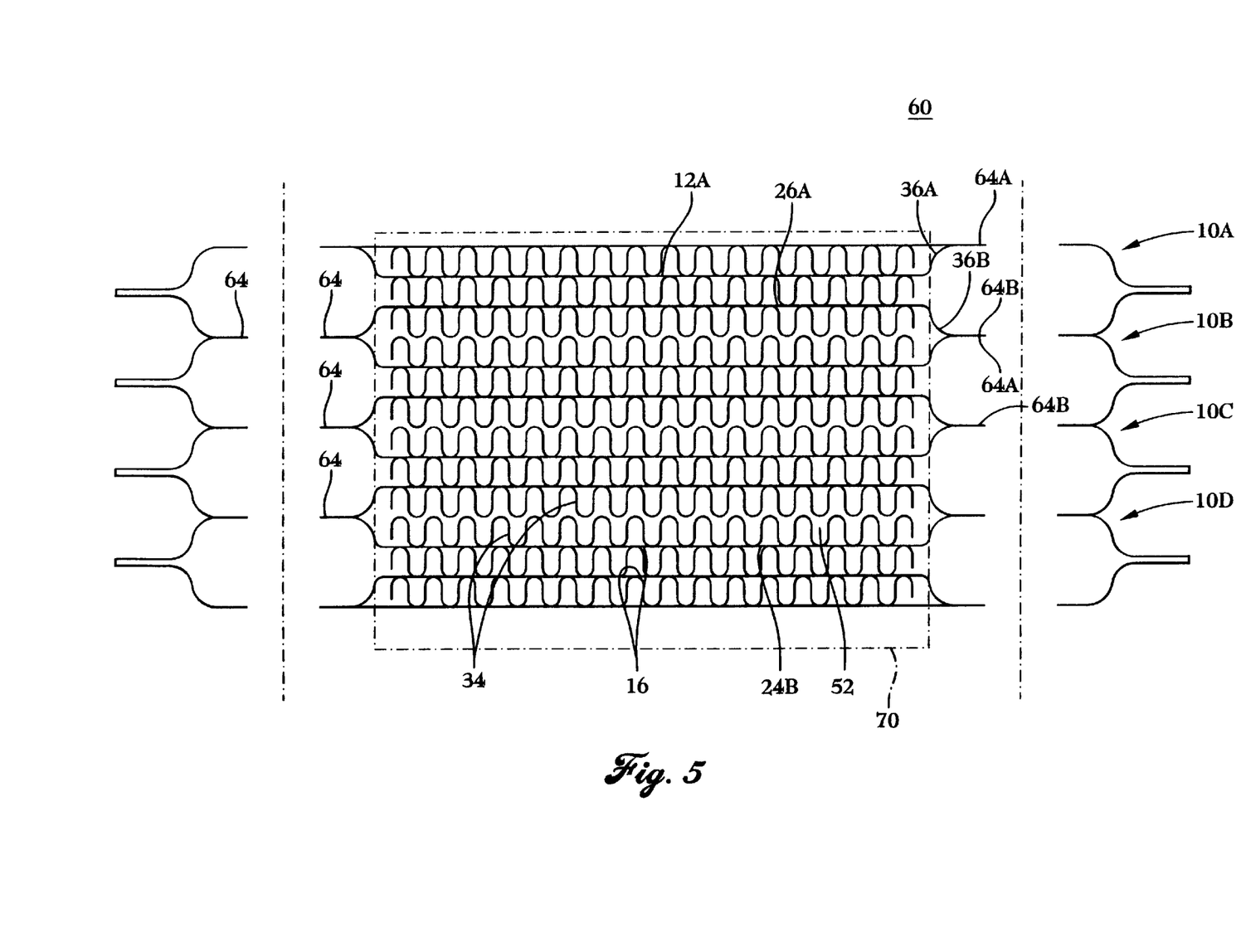
FIG. 5 shows a side view of a counterflow heat exchanger including a plurality of the individual heat exchange cells shown in FIGS. 1–3.
Figure 6:
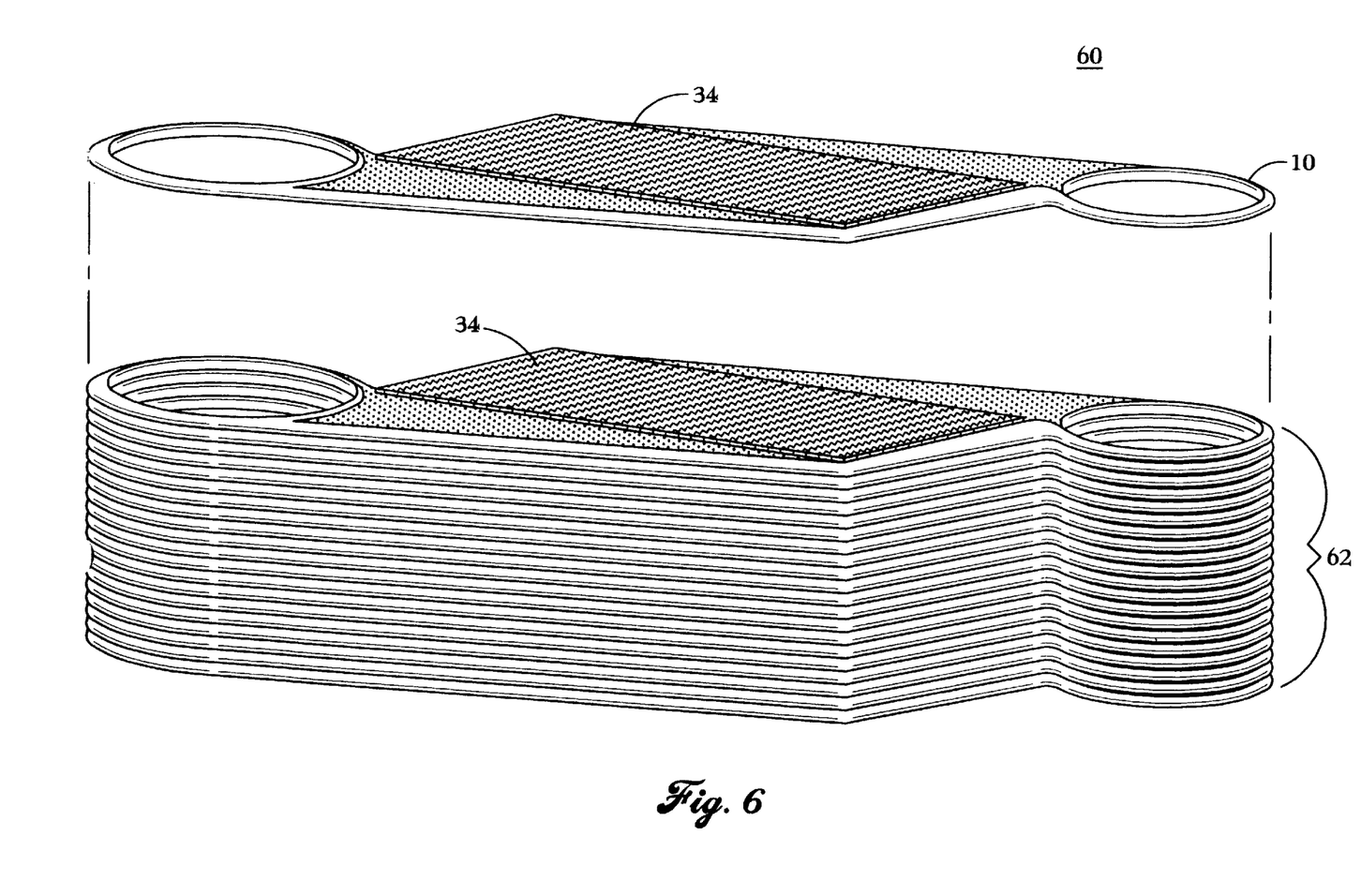
FIG. 6 shows a perspective view of a counterflow heat exchanger including a plurality of the heat exchange cells shown in FIGS. 1–3, in accordance with one preferred embodiment of the present invention.

Referring to FIGS. 5 and 6, in preferred embodiments, a heat exchanger 60 is provided by assembling two or more heat exchange cells 10 one atop the other with the adjacent interior edges of adjacent heat exchange cells attached together for forming a compliant bellows structure 62 capable of elastically absorbing deflections produced during thermal loading so that the individual heat exchange cells may move relative to one another. For example, FIG. 5 shows a heat exchanger including stacked heat exchange cells 10A, 10B, 10C and 10D. Heat exchange cell 10A includes top plate 12A having substantially S-shaped raised flange portion 36A with interior edge 64A and bottom plate 26A having substantially S-shaped raised flange portion 36B with interior edge 64B. Heat exchange 10B is substantially similar to heat exchange cell 10A and also includes interior edges 64A and 64B. The heat exchange cells 10A and 10B are attached together solely through the adjacent interior edges (e.g., such as by welding the interior edge 648 of heat exchange cell 10A with the interior edge 64A of heat exchange cell 10B). The portions of the substantially S-shaped raised flanges 36 remote from the interior edges 64 are not attached to an adjacent heat exchange cell. This allows the substantially S-shaped raised flanges to flex in response to compression and tension forces. The process is continued until the heat exchange cells 10A–10D are attached together through the adjacent interior edges.

The external finned members 34 of adjacent heat exchange cells 10 are not attached or bonded together so that the individual heat exchange cells are free to move relative to one another during heating up and cooling down of the heat exchanger. As mentioned above, the welded interior edges of the substantially S-shaped raised flanges form a compliant bellows structure capable of elastically absorbing deflections produced during thermal loading so that the individual heat exchange cells may move relative to one another. The compliant nature of the bellows structure minimize stresses and strains placed upon the heat exchanger structure.

In addition, prior art heat exchangers typically include gas header fins adjacent the external finned members 34 attached to the top and bottom plates. The gas header fins are typically provided for 1) directing flow into the heat exchanger matrix; 2) providing compressive strength to react pressure; and 3) providing a continuous load path between the layers during assembly and manufacturing. The present invention does not require such gas header fins due, inter alia, to the fact that each individual cell is pressure balanced (i.e., includes its own internal high pressure chamber so that each individual heat exchange cell may function, if necessary, as a complete heat exchanger). Thus, the absence of gas header fins from the individual heat exchange cells of the present invention provides numerous benefits including providing flexibility to the cell that enables the cell to deflect out-of-plane and thus respond to thermal gradients.

Figure 9:
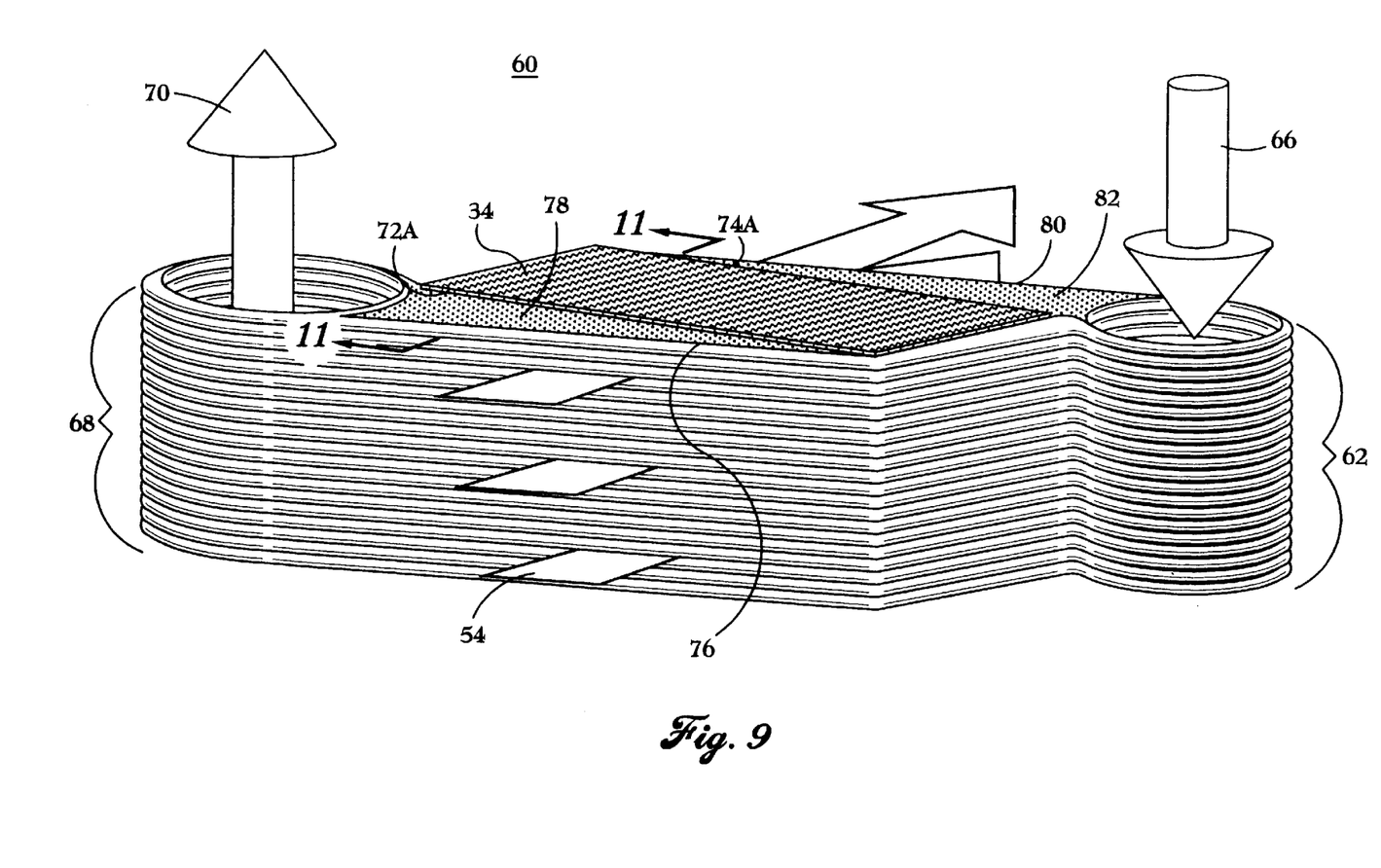
FIG. 9 shows the flow of first and external fluids through the heat exchanger of FIG. 6 in accordance with certain preferred embodiments of the present invention.
Figure 10:
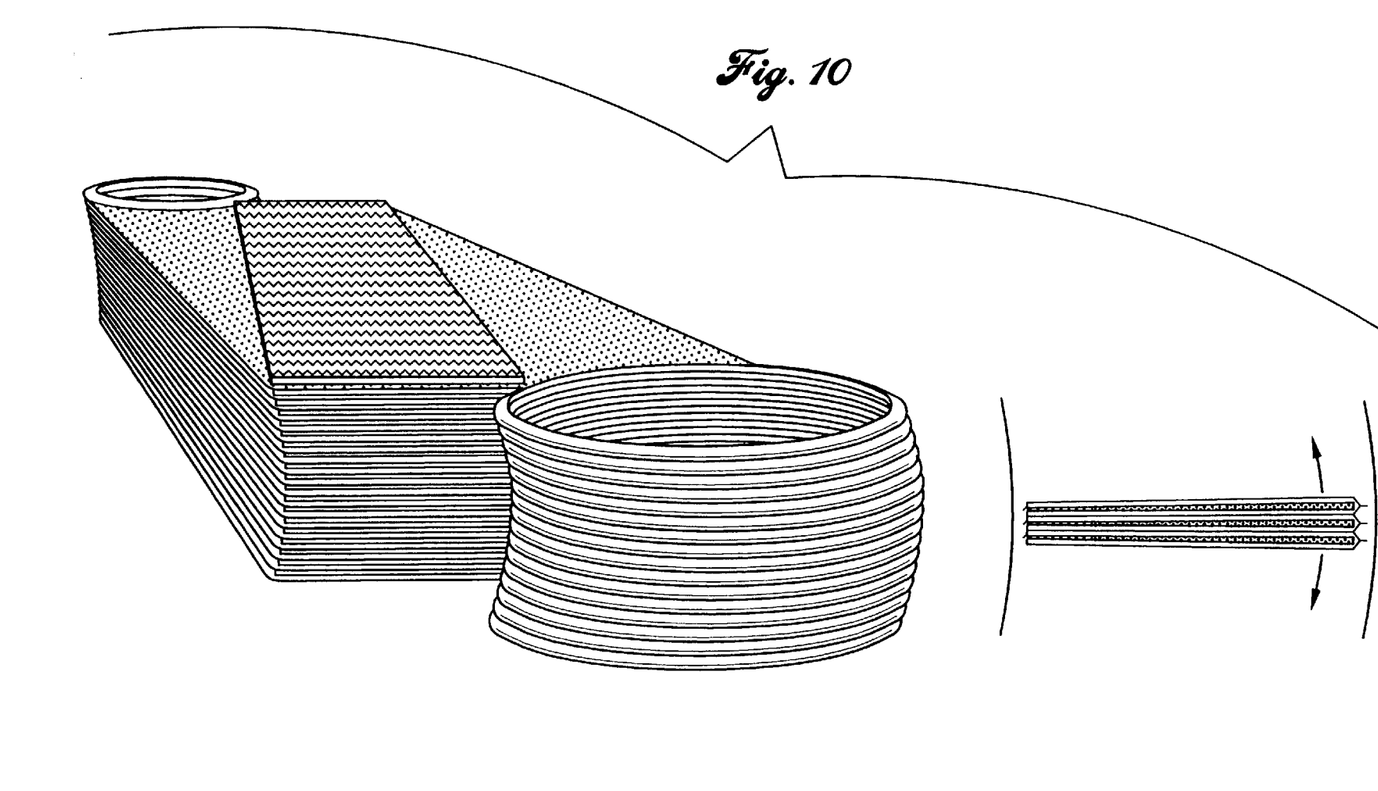
FIG. 10 shows a perspective view of the heat exchanger of FIG. 6 after thermal loading whereby the structure flexes in response to thermal forces.

Referring to FIG. 9, during operation of one preferred embodiment of the heat exchanger 60, the external fluid, such as a heated exhaust gas, travels in the direction designated 54 and through the external finned members 34 of the stacked heat exchange cells 10. At the same time, the internal fluid, such as a relatively cool compressor discharge air travels through the compliant inlet manifold structure 62 in a downward direction designated 66. Referring to FIG. 3, the internal fluid then passes in succession though the inlet manifold finned member 58A, the internal finned member 33 and the outlet manifold finned member 58B. At least some of the heat present in the external fluid is transferred to the internal fluid as the heat is transferred from the external finned members to the internal finned member. Referring to FIG. 9, the internal fluid then passes from the outlet manifold finned members of the respective cells 10 to the outlet manifold structure 68 in the direction designated 70. The temperature of the internal fluid discharged from the heat exchanger 60 is typically higher than the temperature of the internal fluid entering the heat exchanger. Referring to FIG. 10, the compliant nature of the inlet and outlet manifolds and the individual plates enables the cells of the heat exchanger to move relative to one another during operation so as to minimize the adverse affects that may result from thermal expansion and contraction. During operation, there is no need to apply external forces to the outside of each heat exchange cell 10 in order to hold the cell together because, inter alia, the internal finned member 33 is fully adhered to the top and bottom plates 12, 26 (which provides resistance against differential pressure load).

Figure 13:
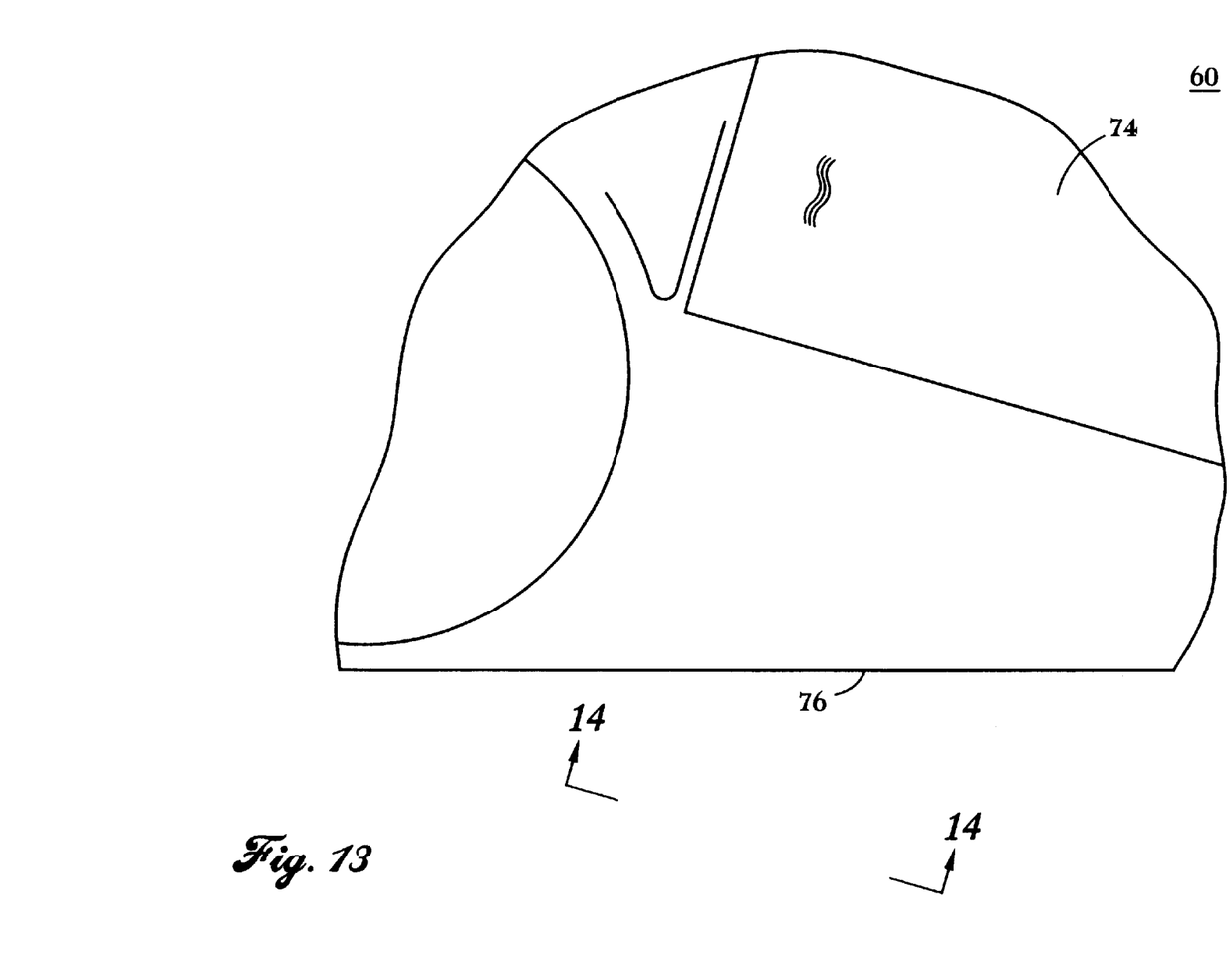
FIG. 13 shows a fragmentary top view of the heat exchanger shown in FIG. 9.

Referring to FIGS. 1, 2 and 13, in certain preferred embodiments the first and second external finned members 34A and 51B of each heat exchange cell may include substantially aligned leading edges 72A and 89B that are desirably adapted for receiving the external fluid passing between the cell layers. The first and second external finned members may also include trailing edges 74A and 91B adapted for discharging the external fluid therefrom after the external fluid has passed completely through the external finned members. The substantially aligned leading edges 72A and 89B of the first and second external finned members 34A and 51B are desirably substantially remote from a leading peripheral edge 76 of the heat exchange cell 10. In other words, Referring to FIG. 11, there exists a space or gap 78 between the aligned leading edges 72A and 89B of the external finned members and the leading peripheral edge 76 of the heat exchange cell 10. The space 78 enables the individual cells to move toward and away from one another. Referring to FIG. 2, the substantially aligned leading edges 72A and 89B of the first and second external finned members 34A and 51B may also be substantially offset from the aligned outlet apertures 22 forming the flexible outlet manifold structure 68 for also enabling each cell to deflect toward and away from a heat exchange cell adjacent thereto.

Referring to FIGS. 1, 2 and 13, in other preferred embodiments, the trailing edges 74A and 91B of the first and second external finned members 34A and 51B may also be in substantial alignment with one another and substantially remote from a rear peripheral edge 80 of the heat exchange cell 10. There preferably exists a space or gap 82 between the trailing edge 74A of the external finned member 34 and the rear peripheral edge 80 of the cell for enabling each individual cell to deflect toward and away from a heat exchange cell adjacent thereto. The substantially aligned trailing edges 74A and 91B of the first and second external finned members 34A and 51B are substantially offset from the aligned inlet apertures 20 forming the flexible inlet manifold structure 62 of the heat exchanger 60 for enabling each cell to deflect toward and away from a heat exchange cell adjacent thereto.

Figure 11:
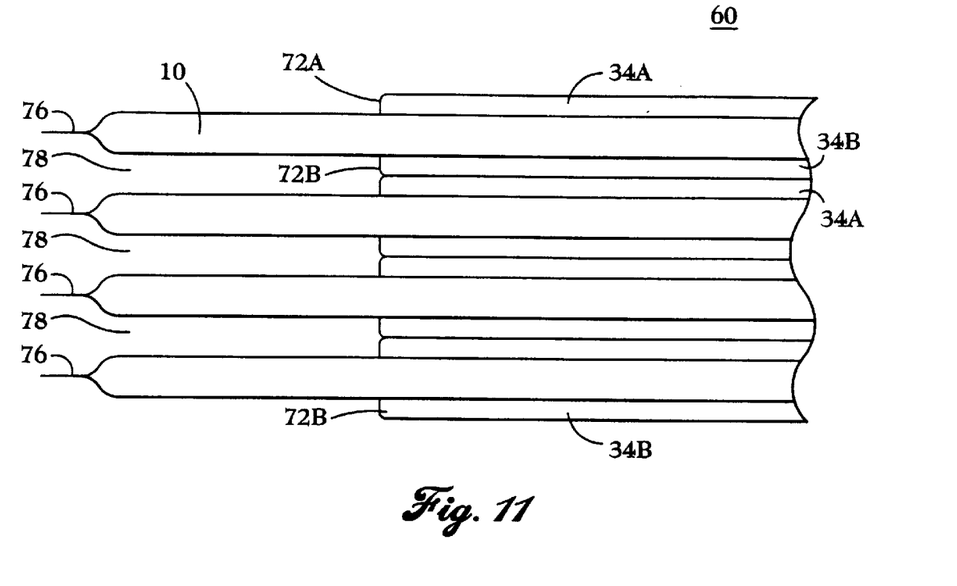
FIG. 11 shows a cross-sectional view of the heat exchanger shown in FIG. 9 taken along line XI—XI, before thermal loading.
Figure 12:
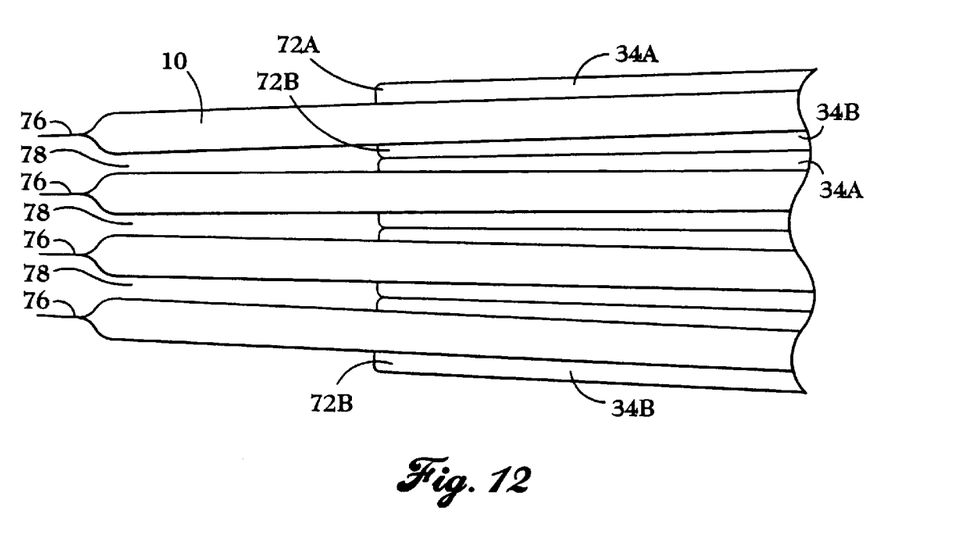
FIG. 12 shows the heat exchanger of FIG. 11 after thermal loading whereby the structure flexes in response to thermal forces.

FIG. 11 shows a fragmentary cross-sectional view of the heat exchanger shown in FIG. 9 before the bellows structures have flexed and/or bowed in response to thermal forces. The various cell layers are substantially parallel to one another because, inter alia, the heat exchanger is not under thermal stress. The leading edges 72A and 89B of the external finned members 34A and 51B are remote from the leading peripheral edge 76 of the cell, thereby providing a gap 78 that extends between the adjacent cell layers. FIG. 12 shows a fragmentary crosssectional view of the heat exchanger of FIG. 9 after thermal loading whereby the heat exchanger flexes, bends and/or deflects in response to thermal forces. The leading peripheral edges 76 of the respective cell layers are able to move toward one another because the gaps 78 provide room into which the respective cell layers may move, thereby providing the heat exchanger with enhanced flexibility.

Figure 14A:
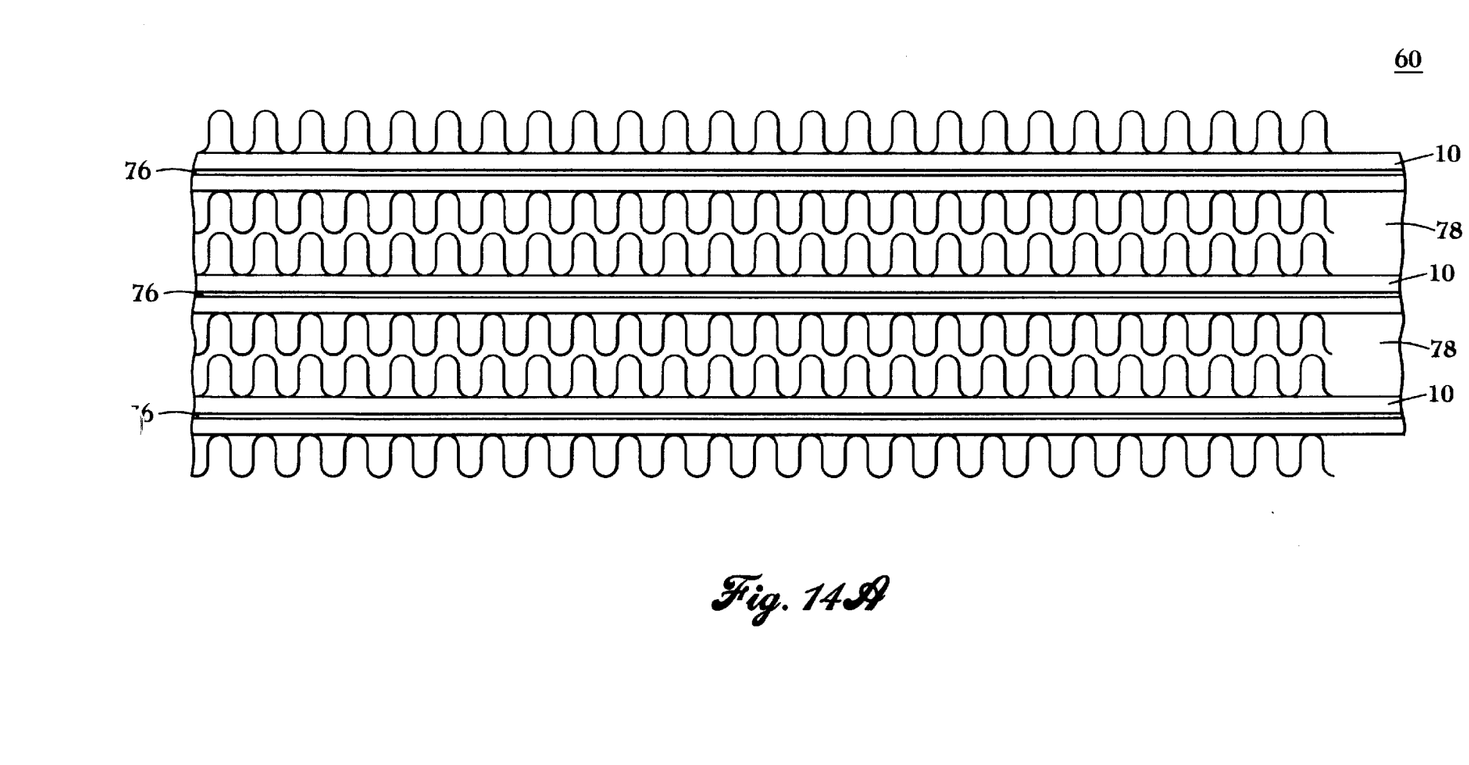
FIG. 14A shows a front view of the heat exchanger shown in FIG. 13 along line XIV—XIV when the heat exchanger is in an undeflected "cold" state.
Figure 14B:
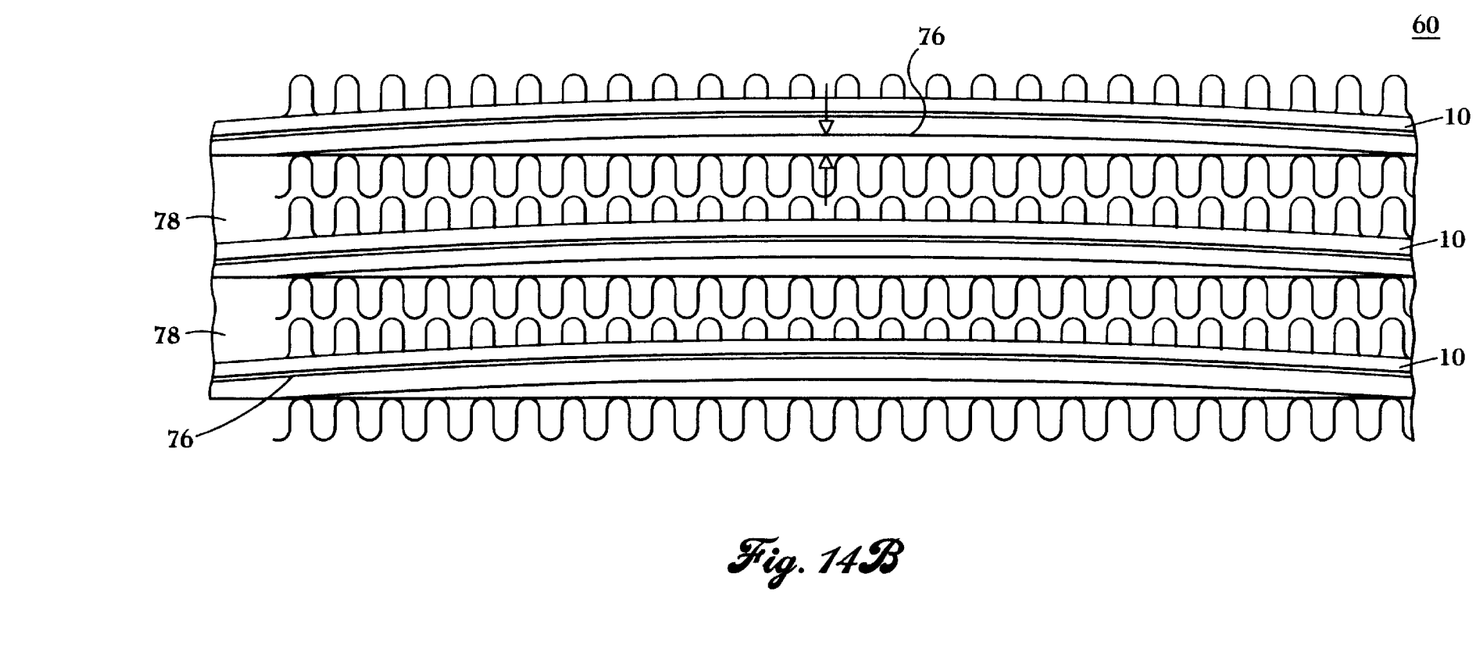
FIG. 14B shows a front view of the heat exchanger shown in FIG. 13 along line XIV—XIV when the heat exchanger is in a deflected "hot" state.

FIG. 13 shows a top fragmentary view of the heat exchanger 60 shown in FIGS. 9 and 14. FIGS. 14A and 18B show a front view of the heat exchanger 60 taken along line XIV—XIV of FIG. 13. FIG. 14A shows the heat exchanger in an undeflected "cold" state, i.e., before the cell layers 10 have flexed and/or bowed in response to thermal forces. As shown in FIG. 14A, the leading edges 76 of the various cell layers 10 are substantially flat and parallel to one another. FIG. 14B shows the heat exchanger in a deflected "hot" state, i.e., after the leading edges 76 of the respective cells layers 10 have flexed and/or bowed in response to thermal forces. As shown in FIG. 14B, at least some of the leading edges 76 have flexed and/or deflected away from cell layers 10 adjacent thereto. As mentioned above, the leading peripheral edges 76 of the respective cell layers 10 are able to deflect toward and away from adjacent cell layers because the leading edges 76 are remote from the leading edges 72 of the external finned members 74 for forming form gaps 78 into which the respective cell layers 10 may move and/or deflect, thereby providing the heat exchanger 60 with enhanced flexibility.

In one preferred method of assembling individual heat exchange cells 10, the top and bottom plates 12, 26 (also known as parting plates) are formed from 0.010–0.050 inch stainless or super alloy steel sheet in roll form. The sheet is unrolled and then the plates are formed by stamping and laser trimming. The external finned members 34 and gas turning fins 52 are formed from 0.003–0.010 inch rolled stainless or super alloy steel. The metal is unrolled, the fins are folded and braze coating is sprayed onto one side of the external finned member 34 and the gas turning fin 52. The braze coated external finned member 34 and gas turning fin 52 are then laser trimmed and cleaned. Instead of applying a braze coat to the external finned member 34 and gas turning fin 52, the first surfaces 14, 28 of the respective top and bottom plates 12, 26 may be coated with the braze coating. The internal finned member 33 and the inlet and outlet manifold finned members 46, 48 are formed from 0.003–0.010 inch rolled stainless or super alloy steel. The metal is unrolled, the fins are folded and braze coating is sprayed onto both sides of the internal finned member 33 and the inlet and outlet manifold finned members 46, 48. The braze coated internal finned member 33 and inlet and outlet manifold finned members 46, 48 are then laser trimmed and cleaned. Instead of applying a braze coat to the internal finned member 33 and the inlet and outlet manifold finned members 46, 48, both inside surfaces of the top and bottom plates 12, 26 may be braze coated.

The top and bottom plates 12, 26; the two external finned members 34A, 34B; the internal finned member 33; and the inlet and outlet manifold finned members 46, 48 are assembled to form an individual heat exchange cell 10. The individual pieces are tack welded to temporarily hold the pieces together. In addition, the peripheral edge of the assembled individual heat exchange cell 10 may be laser welded.

One or more assembled individual heat exchange cells 10 are then preferably placed into a braze cell where the individual cells 10 are heated to braze the coated surfaces to one another. Various brazing jig components can be used to load the individual heat exchange cells 10 to minimize any distortion of the cells 10 during the brazing process. FIGS. 7 and 8 illustrate a preferred embodiment of the top and bottom plates 12, 26, including a reservoir 54 provided in top plate 12. This reservoir 54 holds additional braze coating which will spread in the adjacent surfaces of the interior of an individual heat exchange cell 10 during the brazing process.

After brazing, each heat exchange cell 10 is pressurized to check for any leaks caused by inadequate brazing. A plurality of individual heat exchange cells 10 are then assembled into a partial stack and the interior edges of the substantially S-shaped raised flanges 36, 38 are welded together. These partial stacks are then pressure tested again. A plurality of partial stacks are then welded together to provide a heat exchanger. Transition pieces (not shown) may be attached to outer individual heat exchange cells 10 to provide a place to connect the heat exchanger to the inlet and outlet manifolds of the equipment the heat exchanger is a part of.

The above disclosure describes only certain preferred embodiments of a heat exchanger and is not intended to limit the scope of the present invention to the exact construction and operation shown and described herein. The foregoing is considered to merely illustrate certain principles of the invention. Thus, it should be evident to those skilled in the art that numerous modifications and changes may be made to the embodiments shown herein while remaining within the scope of the present invention as described and claimed.

What is claimed is:

1. A method of making a heat exchanger comprising:
    assembling a first heat exchange cell including:
        providing a top plate having an inlet aperture at one end thereof and an outlet aperture at the other end thereof, said top plate including a first surface, a second surface and peripheral edges;
        providing a bottom plate having an inlet aperture at one end thereof and an outlet aperture at the other end thereof, said bottom plate including a first surface, a second surface and peripheral edges;
        juxtaposing the second surface of the bottom plate with the second surface of the top plate, wherein the inlet and outlet apertures of said top and bottom plates are in substantial alignment with one another; and
        attaching the peripheral edges of said top and bottom plates to one another to form a high pressure chamber between the second surfaces of said plates;
    after assembling the first cell, testing the first cell;
    assembling a second cell in the same manner as set forth in the above act of assembling a first cell;
    after assembling the second cell, testing the second cell; and
    after testing the first and second cells, metallurgically bonding the first and second cells together to create a multi-cell heat exchanger.

2. The method as claimed in claim 1, wherein the acts of testing the first and second cells include checking the high pressure chamber of the respective cells for defects.

3. The method as claimed in claim 1, wherein the acts of testing the first and second cells include pressure testing the high pressure chambers of the respective cells.

4. The method as claimed in claim 1, wherein the acts of assembling the first and second cells further include:
    providing an internal finned member between the second surfaces of said top and bottom plates before the attaching the peripheral edges step; and
    attaching the internal finned member to the second surfaces of said top and bottom plates.

5. The method as claimed in claim 4, wherein the attaching the internal finned member step includes:
    applying a braze coating between the internal finned member of each cell and the second surfaces of the top and bottom plates of the same cell; and
    brazing the internal finned member of the first and second cells to the second surfaces of the top and bottom plates of the respective first and second cells.

6. The method as claimed in claim 2, wherein the inlet and outlet apertures of the top and bottom plates of each cell include raised flange portions extending away from the first surfaces of said plates.

7. The method as claimed in claim 6, wherein the raised flange portions of aid apertures are substantially S-shaped and terminate at interior edges bounding a said apertures.

8. The method as claimed in claim 7, wherein said substantially S-shaped raised flange portions are curvilinear.

9. The method as claimed in claim 7, wherein the top and bottom plates including the flange portions thereof are substantially uniform in thickness.

10. The method as claimed in claim 1, further comprising attaching an external finned member to one of the first surfaces of said top and bottom plates of at least one of the first and second cells.

11. The method as claimed in claim 4, further comprising:
    attaching a first external finned member to the first surface of said top plate of at least one of the cells; and
    attaching a second external finned member to the first surface of said bottom plate of at least one of the cells.

12. The method as claimed in claim 11, wherein said top plate of at least one of the first and second cells includes a substantially flat central region between the inlet and the outlet apertures thereof and said bottom plate of at least one of the first and second cells includes a substantially flat central region between the inlet and outlet apertures thereof, said substantially flat central regions being in substantial alignment with one another.

13. The method as claimed in claim 12, wherein the internal finned member of each cell is in substantial alignment with the first and second external finned members.

14. The method as claimed in claim 1, wherein the attaching the peripheral edges of said top and bottom plate includes welding the peripheral edges of said top and bottom plate together.

15. The method as claimed in claim 1, further comprising:
    aligning the inlet and outlet apertures of the respective first and second cells with one another prior to said act of metallurgically bonding; and
    attaching the inlet and outlet apertures of the first and second cells to one another to form a partial stack of heat exchange cells.

16. The method as claimed in claim 15, further comprising testing at least one of said heat exchange cells in said partial stack for defects.

17. The method as claimed in claim 16, further comprising replacing a defective heat exchange cell with another heat exchange cell.

18. The method as claimed in claim 15, further comprising replacing at least one of said heat exchange cells in said partial stack.

19. The method as claimed in claim 16, further comprising:
removing a defective one of said heat exchange cells from said partial stack;
providing a replacement heat exchange cell and attaching said replacement heat exchange cell to said partial stack.

20. The method as claimed in claim 16, wherein the testing step includes checking the high pressure chamber of at least one of said heat exchange cells in said partial stack.

21. The method as claimed in claim 16, wherein the testing step includes pressure testing at least one of said assembled heat exchange cells in said partial stack.

22. The method as claimed in claim 15, wherein the top and bottom plates of the respective cells include a raised flange substantially surrounding the inlet and outlet apertures, and wherein the attaching the inlet and outlet apertures step includes attaching the interior edges of the raised flanges of said heat exchange cells to one another for forming a compliant bellows structure elastically absorbing deflections produced during thermal loading of said heat exchanger so that said heat exchange cells move and flex relative to one another.

23. The method as claimed in claim 22, wherein the attaching the interior edges of the raised flanges step includes welding the interior edges together for forming a pressure-tight seal between the inlet and outlet apertures of adjacent heat exchange cells.

24. The method as claimed in claim 22, wherein adjacent heat exchange cells are attached to one another solely through the interior edges of said raised flanges.

25. The method as claimed in claim 15, further comprising assembling two or more of said partial stacks of said heat exchange cells atop one another so as to form said heat exchanger, wherein the inlet and outlet apertures of said heat exchange cells are in substantial alignment with one another.

26. The method as claimed in claim 25, further comprising testing at least one of said partial stacks before the assembling two or more of said partial stacks step.

27. The method as claimed in claim 26, wherein the testing step includes pressure testing.

28. A method for making a heat exchanger, the method comprising:
assembling a first heat exchange cell by providing top and bottom sheets, each having an inlet aperture and an outlet aperture, aligning the inlet and outlet apertures of the top and bottom sheets, and sealing a peripheral edge of the top sheet to a peripheral edge of the bottom sheet to define a high pressure chamber, the high pressure chamber being open only at the inlet and outlet apertures of the top and bottom sheets;
assembling a second cell in the same manner as set forth in the above act of assembling a first cell;
testing the first and second cells to ensure that the respective high pressure chambers are open only at the inlet and outlet apertures of the respective top and bottom sheets; and
after testing the first and second cells, metallurgically bonding the first and second cells together to form a multi-cell heat exchanger.

29. The method of claim 28, further comprising, after said act of metallurgically bonding, testing the first and second cells to ensure that the respective high pressure chambers are open only at the inlet and outlet apertures of the respective top and bottom sheets.

30. The method of claim 28, wherein said act of assembling the first and second cells further includes positioning an internal finned member between the top and bottom sheets prior to sealing the peripheral edges of the top and bottom sheets.

31. The method of claim 28, wherein sealing the peripheral edges of the top and bottom sheets of each cell includes laser welding the peripheral edges together.

32. A method for assembling a heat exchanger, the method comprising:
assembling a plurality of cells, each cell being assembled by providing top and bottom sheets, the top and bottom sheets each having an inlet aperture and an outlet aperture, aligning the inlet and outlet apertures of the top and bottom sheets, and sealing a peripheral edge of the top sheet to a peripheral edge of the bottom sheet to define a high pressure chamber in the cell, the high pressure chamber being open only at the inlet and outlet apertures of the top and bottom sheets; and then
pressure testing each assembled cell; and then
assembling a plurality of partial stacks of cells, each stack including two or more cells; and then
metallurgically bonding the cells within each partial stack to each other; and then
pressure testing the cells in each partial stack; and then
metallurgical bonding the partial stacks to each other to form a multi-cell heat exchanger.

33. The method of claim 32, further comprising,
after pressure testing each assembled cell and before assembling a plurality of stacks, replacing cells identified as defective during the pressure testing; and
after pressure testing the partial stacks and before metallurgically bonding the partial stacks, replacing partial stacks identified as having defective cells during the pressure testing of the partial stacks.

34. The method of claim 32, wherein said act of assembling a plurality of cells includes, for each cell, applying a braze alloy to at least one surface of at least one of the top and bottom sheets, positioning a finned member in contact with the braze alloy, and brazing the finned member to the at least one of the top and bottom sheets.

35. The method of claim 32, wherein said act of assembling a plurality of cells includes, for each cell, tack welding the top and bottom sheets together prior to sealing the peripheral edges of the top and bottom sheets together.

36. The method of claim 32, wherein said act of sealing the peripheral edges includes laser welding the peripheral edges together.

* * * * *